United States Patent
Nakaoka et al.

(10) Patent No.: US 7,067,382 B2
(45) Date of Patent: Jun. 27, 2006

(54) SEMICONDUCTOR DEVICE AND METHOD FOR FABRICATING THE SAME

(75) Inventors: Hiroaki Nakaoka, Kyoto (JP); Kentaro Nakanishi, Nara (JP); Hiroyuki Umimoto, Hyogo (JP); Atsuhiro Kajiya, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 10/853,128

(22) Filed: May 26, 2004

(65) Prior Publication Data

US 2005/0003621 A1 Jan. 6, 2005

(30) Foreign Application Priority Data

May 29, 2003 (JP) .............................. 2003-153021

(51) Int. Cl.
*H01L 21/336* (2006.01)
(52) U.S. Cl. ....................................... 438/301; 438/530
(58) Field of Classification Search ................ 438/301, 438/305, 306, 307, 308, 530, 795
See application file for complete search history.

(56) References Cited

U.S. PATENT DOCUMENTS 5,981,347 A * 11/1999 Kuo et al. ................... 438/308
6,362,511 B1 * 3/2002 Mizushima et al. ......... 257/412
6,770,519 B1 * 8/2004 Ito et al. ...................... 438/197

FOREIGN PATENT DOCUMENTS

JP         6-275788        9/1994

* cited by examiner

*Primary Examiner*—Phuc T. Dang
(74) *Attorney, Agent, or Firm*—McDermott Will & Emery LLP

(57) ABSTRACT

As first thermal treatment for activating an impurity injected into a gate electrode, thermal treatment at a low temperature for a long time in which boron diffusion into each crystal grain in polysilicon hardly occurs and boron diffusion in each crystal boundary occurs is performed. Next, as second thermal treatment, thermal treatment at a high temperature for a short time, such as spike annealing and flash annealing, in which impurity diffusion into each crystal grain in a polysilicon layer occurs is performed.

11 Claims, 7 Drawing Sheets

SEMICONDUCTOR DEVICE AND METHOD FOR FABRICATING THE SAME

BACKGROUND OF THE INVENTION

The present invention relates to a semiconductor device including a gate electrode which includes a polysilicon film and a method for fabricating the same, and more particularly relates to a measure for improving properties of a gate electrode.

In recent years, it has been required to improve the performance of semiconductor devices and, more specifically, MIS transistors (MISFETs) and also to reduce the power consumption thereof. To achieve improvement of performance and reduction in power consumption for semiconductor devices, reduction in OFF leakage current and suppression of the short channel effect are effective. Thus, semiconductor devices having a dual gate structure in which respective gate electrodes of an n-channel MISFET and a p-channel MISFET contain impurities (dopants) of different conductive types to each other, respectively, have been adopted (e.g., see Reference 1 (Japanese Laid-Open Publication No. 6-275788)).

FIGS. 7A through 7F and FIGS. 8A through 8E are cross-sectional views illustrating respective steps for fabricating a known semiconductor device having a dual gate structure.

Figure 7A:
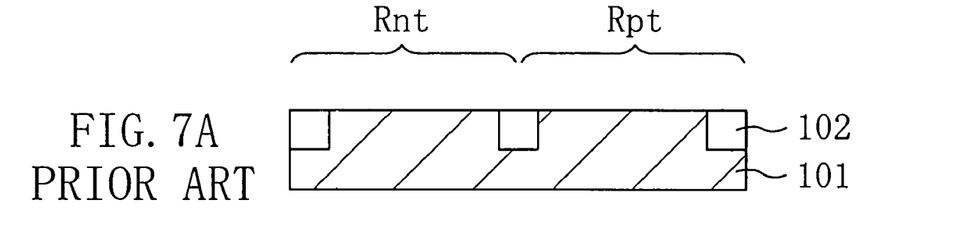
FIGS. 7A through 7F are cross-sectional views illustrating first half of steps for fabricating a known semiconductor device.
Figure 7B:
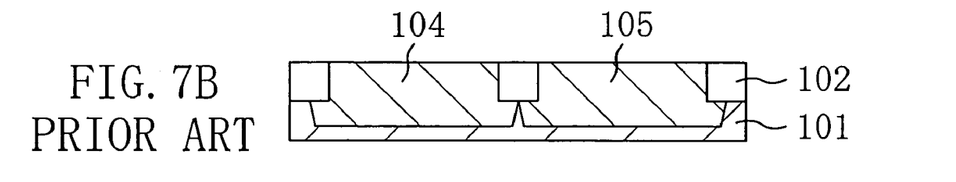

First, in the process step of FIG. 7A, an isolation region 102 for dividing a surface region into a plurality of active regions is formed on a p-type semiconductor substrate 101, and then, in the process step of FIG. 7B, impurity injection for adjusting threshold and impurity injection for forming a well are performed to form a p-type well 104, i.e., an active region for an n-channel MISFET (NMISFET formation region Rnt) and an n-type well 105, i.e., an active region for a p-channel MISFET (PMISFET formation region Rpt).

Figure 7C:
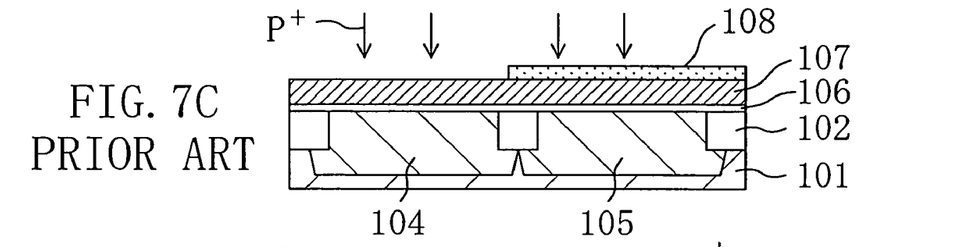

Next, in the process step of FIG. 7C, a gate insulating film 106 is formed on each of the wells 104 and 105 and a polysilicon film 107 is deposited over the gate insulating film 106. Thereafter, a resist film 108 covering the PMISFET formation region Rpt is formed, and then, using the resist film 108 as a mask, ions of phosphorus ($P^+$), i.e., an n-type impurity are implanted into part of the polysilicon film 107 located in the NMISFET formation region Rnt.

Figure 7D:
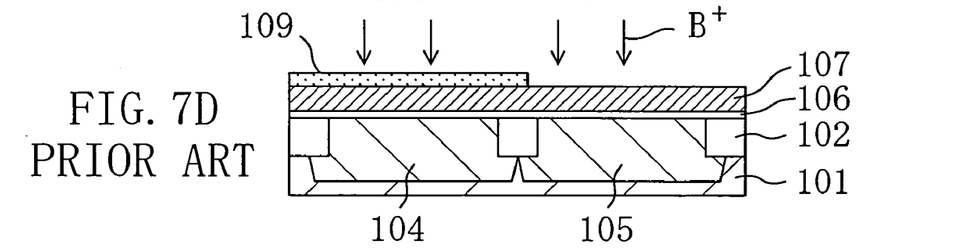

Moreover, in the process step of FIG. 7D, using a resist film 109 covering the NMISFET formation region Rnt as a mask, ions of boron ($B^+$), i.e., a p-type impurity are implanted into part of the polysilicon film 107 located in the PMISFET formation region Rpt.

Figure 7E:
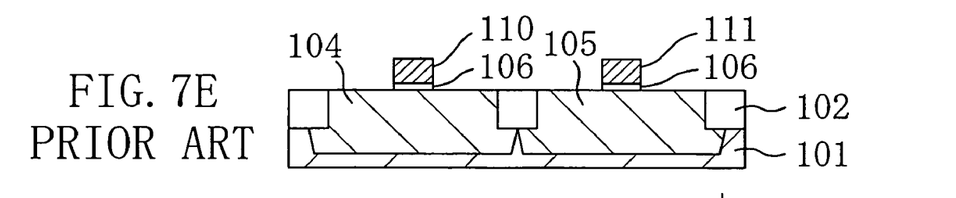

Next, in the process step of FIG. 7E, the polysilicon film 107 is patterned to form a gate electrode 110 of an n-channel MISFET and a gate electrode 111 of a p-channel MISFET. Note that in this case, the gate insulating film 106 may be left as it is or patterned so as to have the same shape as that of the gate electrodes 110 and 111, as shown in FIG. 7E.

Figure 7F:
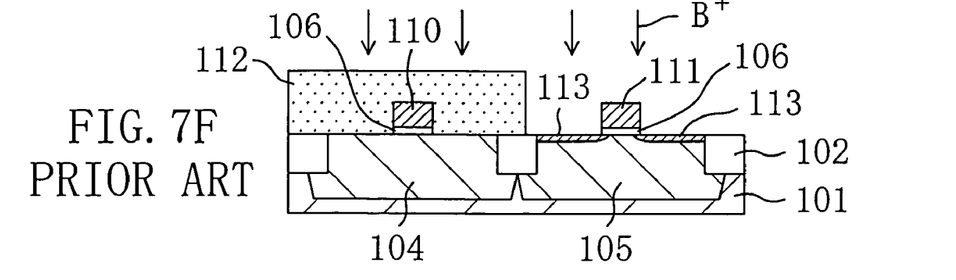

Next, in the process step of FIG. 7F, using the resist film 112 covering the NMISFET formation region Rnt and the gate electrode 111 as masks, boron fluoride ions ($BF_2^+$) are implanted into the n-type well 105 to form a lightly doped impurity region 113 to serve as an LDD region or an extension region of the PMISFET.

Figure 8A:
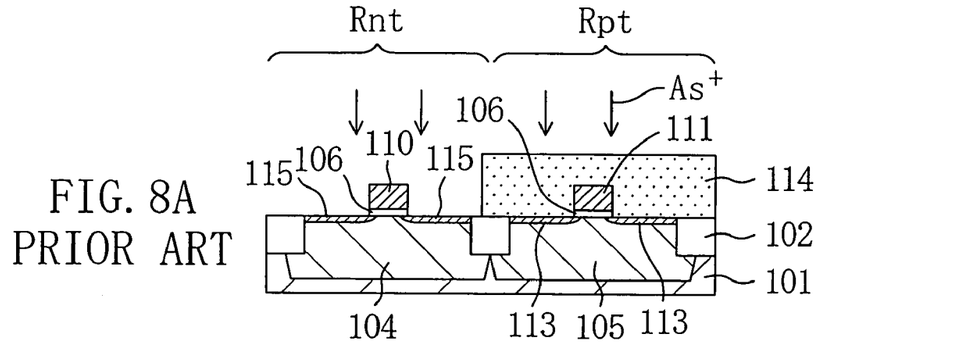
FIGS. 8A through 8E are cross-sectional views illustrating latter half of steps for fabricating the known semiconductor device.

Next, in the process step of FIG. 8A, using a resist film 114 covering the PMISFET formation region Rpt and the gate electrode 110 as masks, phosphorus ions ($P^+$) are implanted into the p-type well 104 to form a lightly doped impurity region 115 to serve as an LDD region or an extension region of the NMISFET.

Figure 8B:
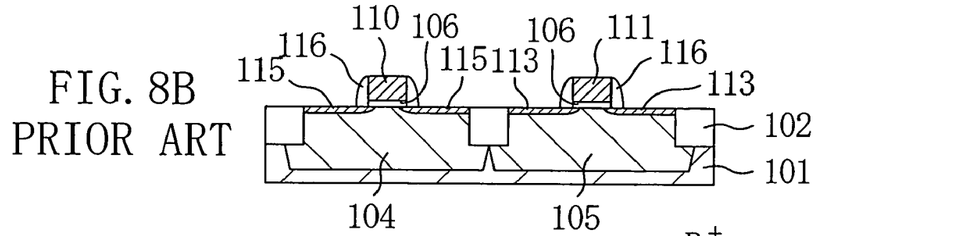

Next, in the process step of FIG. 8B, an insulating film such as a silicon oxide film and a silicon nitride film is deposited over the substrate, and then the insulating film is etched back to form a sidewall 116 covering each of side surfaces of the respective gate electrodes 110 and 111 of the MISFETs.

Figure 8C:
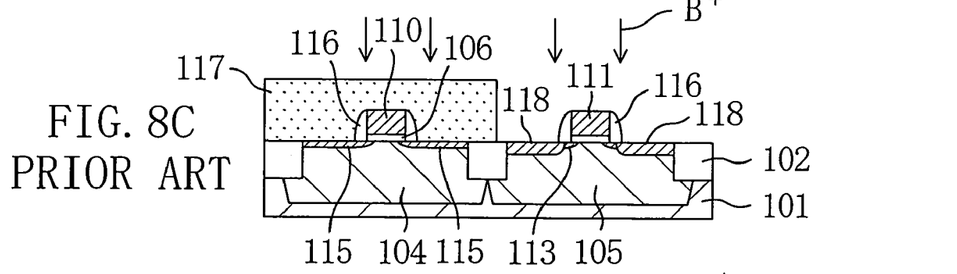

Next, in the process step of FIG. 8C, using the resist film 117 covering the NMISFET formation region Rnt, the gate electrode 111 and the sidewall 116 as masks, boron fluoride ions ($BF_2^+$) are implanted into the n-type well 105 to form a heavily doped impurity region 118 to serve as a source/drain region of the PMISFET.

Figure 8D:
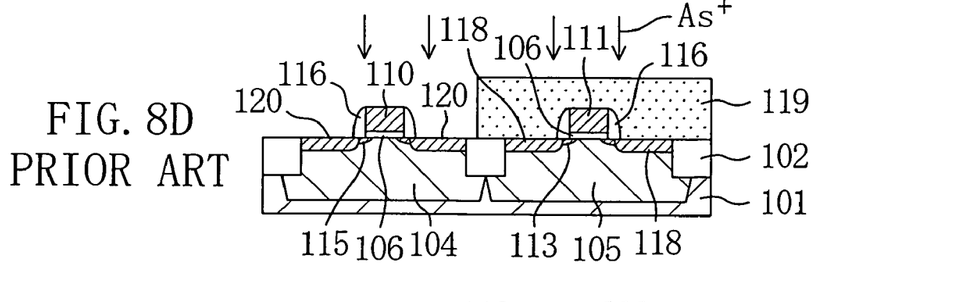

Next, in the process step of FIG. 8D, using the resist film 119 covering the PMISFET formation region Rpt, the gate electrode 110 and the sidewall 116 as masks, arsenic ions ($As^+$) are implanted into the p-type well 104 to form a heavily doped impurity region 120 to serve as a source/drain region of the NMISFET.

Figure 8E:
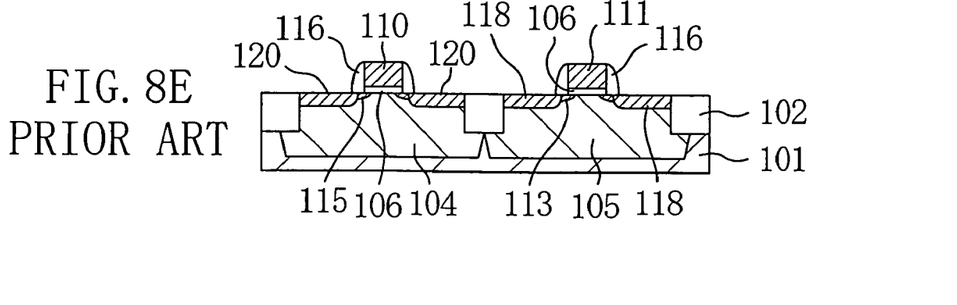

Thereafter, in the process step of FIG. 8E, RTA (thermal treatment at high temperature for a short time) for activating impurities (dopants) implanted into the gate electrodes 110 and 111 and the impurity doped regions 113, 115, 118 and 120. In this case, thermal treatment is performed, for example, at a temperature of about 1050° C. for about 10 seconds.

SUMMARY OF THE INVENTION

In a semiconductor device having a dual gate structure, it is desired that an impurity is introduced into a gate electrode by ion implantation and the impurity is sufficiently activated in the gate electrode in each MISFET. It is also desired that the impurity is diffused in the gate electrode as far as possible to reach a lower portion of the gate electrode.

On the other hand, depending on the distribution state of the impurity in the gate electrode and process conditions, the phenomenon that the impurity (specifically, boron) in the gate electrode passes through the gate insulating film to enter into a channel region (so-called "passing-through" occurs. This phenomenon might result in inconveniences such as change in the threshold voltage of an MISFET. However, if the amount of the impurity in the gate electrode is suppressed to prevent the impurity from entering into the channel region, the problem of reduction in a saturation current value due to depletion arises. As the size of MISFETs is reduced, so that the thickness of a gate electrode is less than 3 nm, it becomes more difficult to avoid both of entrance of the impurity in the gate electrode into a channel region and depletion of the gate electrode.

For example, in the above-described known method for fabricating a semiconductor device, introduction of an impurity into a gate electrode allow suppression of depletion of the gate electrode in a simple manner. However, when the amount of the impurity in the gate electrode, a problem of entrance of the impurity into a channel region from the gate electrode in a subsequent process step (e.g., CVD performed when a sidewall is formed and thermal treatment for activating the impurity) might arise.

Then, a method in which ion implantation of an impurity (specifically, boron) is not performed when a polysilicon film is formed and boron is introduced into the gate electrode 111 simultaneously with the process step of performing ion implantation for forming the heavily doped impurity region 118 shown in FIG. 8C can be also used. However, in this method, if the dose of an impurity is increased to prevent depletion of the gate electrode 111, the heavily doped impurity region 118 becomes too deep due to the increase in the dose, so that the short channel effect easily occurs. If a time for thermal treatment for activating an impurity is reduced to suppress the short channel effect, the impurity in the gate electrode 111 can not be diffused in a region sufficiently close to a gate insulating film (i.e., the lower portion of the gate electrode 111). As a result, the drive capability of the MISFET is reduced due to depletion of the gate electrode 111.

It is therefore an object of the present invention to provide a semiconductor device which includes a gate electrode including a polysilicon layer and allows suppression of both of entrance of an impurity in the gate electrode into a channel region and depletion of the gate electrode.

The present invention has been devised, with focus on that there are two different types of diffusions in polysilicon. First type of diffusion is diffusion in a silicon crystal grain (i.e., a silicon substrate) and second type of diffusion is diffusion along the grain boundary of each crystal grain. The first type of diffusion does not progress unless a temperature is relatively high, as regular diffusion in a silicon substrate. The second type of diffusion progresses at a relatively low temperature and the diffusion rate of the second type of diffusion is larger than that of the first type of diffusion.

Then, a method for fabricating a semiconductor device according to the present invention includes, after the steps of forming a gate electrode and a source/drain region, the step of performing first thermal treatment at a low temperature for a long time and the step of performing second high thermal treatment at a high temperature for a short time.

In this method, an impurity (dopant) is diffused in each grain boundary in the gate electrode due to the first thermal treatment to reach around a lower surface of the gate electrode. In this case, the impurity is diffused only in each grain boundary and the concentration of the impurity around the lower surface of the gate electrode is relatively low. Thereafter, due to the second thermal treatment, the impurity is diffused in each crystal grain from each grain boundary in a relatively uniform manner. Thus, both of depletion of the gate electrode and entrance (passing-through) of the impurity in the gate electrode into an active region (channel region) can be suppressed. Accordingly, a transistor with high drive capability and a stable threshold voltage can be obtained.

Specifically, when the gate electrode contains a p-type impurity (boron), a problem of entrance of the impurity in the gate electrode into a channel region arises. Then, ion implantation of the p-type impurity is not performed before patterning of a silicon film and when ion implantation is performed for forming a source/drain region of a PMISFET, the p-type impurity is introduced into a gate electrode of the PMISFET. Thus, entrance of the impurity in the gate electrode into the channel region can be reliably suppressed through thermal treatment before a source and a drain are formed.

It is preferable that the first thermal treatment is performed at a temperature higher than 550° C. and lower than 650° C. for a time equal to or longer than 10 seconds and the second thermal treatment is performed at a temperature higher than 1000° C. and lower than 1100° C. for a shorter time than 10 seconds.

The gate electrode is formed to include a lower gate electrode made of polysilicon having a large grain size and an upper gate electrode made of polysilicon having a smaller grain size than that of the lower gate electrode and including at least a single layer. Thus, diffusion of the impurity in the lower gate electrode due to the first thermal treatment can be suppressed. Therefore, entrance of the impurity in the gate electrode into a channel region can be effectively suppressed.

In that case, it is preferable that the silicon film is formed to have a multilayer structure including a lower silicon film made of amorphous silicon and at least a single polysilicon film made of polysilicon.

The thickness of the lower silicon film is larger than a dimension by which the heavily doped impurity region serving as the source/drain region is magnified due to the second thermal treatment and smaller than the thickness of the upper silicon film. Thus, entrance of the impurity in the gate electrode into the channel region can be effectively suppressed. An adequate range of the thickness of the lower silicon film is a range of not less than 20 nm and not more than 50 nm.

The semiconductor device of the present invention includes a gate electrode including a lower gate electrode made of polysilicon having a large grain size and an upper gate electrode made of polysilicon having a small grain size and including at least a single layer.

Thus, by performing the first thermal treatment in which an impurity (dopant) is diffused in each grain boundary in the gate electrode and the second thermal treatment in which the impurity is diffused in each crystal grain in the gate electrode in a relatively uniform manner, both of depletion of the gate electrode and entrance (passing-through) of the impurity in the gate electrode into an active region (channel region) can be suppressed.

DESCRIPTION OF THE PREFERRED EMBODIMENTS

First Embodiment

FIGS. 1A through 1F and FIGS. 2A through 2E are cross-sectional views illustrating respective steps for fabricating a semiconductor device according to a first embodiment of the present invention. In this embodiment, respective process steps for fabricating a semiconductor device having a single-layer polysilicon gate structure and a dual gate structure will be described.

Figure 1A:
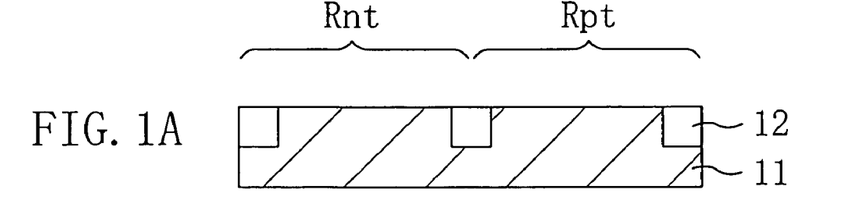
FIGS. 1A through 1F are cross-sectional views illustrating first half of steps for fabricating a semiconductor device according to a first embodiment of the present invention.
Figure 1B:
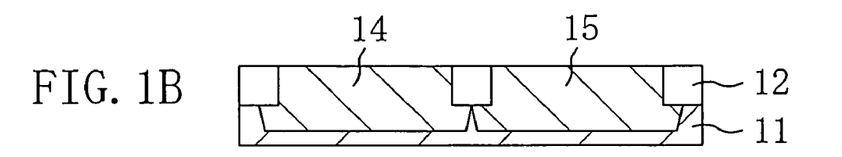

First, in the process step of FIG. 1A, an isolation region 12 for dividing a surface region into a plurality of active regions is formed on a p-type semiconductor substrate (silicon substrate) 11, and then, in the process step of FIG. 1B, impurity injection for adjusting threshold and impurity injection for forming a well are performed to form a p-type well 14, i.e., an active region for an n-channel MISFET (NMISFET formation region Rnt) and an n-type well 15, i.e., an active region for a p-channel MISFET (PMISFET formation region Rpt).

Figure 1C:
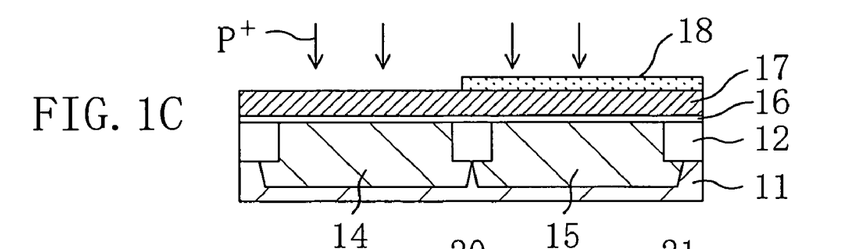

Next, in the process step of FIG. 1C, a gate insulating film 16 is formed on each of the wells 14 and 15 and a polysilicon film 17 is deposited over the gate insulating film 16. In this case, the thickness of the gate insulating film 16 is, for example, about 2 nm. The thickness of the polysilicon film 17 is, for example, about 160 nm. Thereafter, a resist film 18 covering the PMISFET formation region Rpt is formed, and then, using the resist film 18 as a mask, ions of phosphorus ($P^+$), i.e., an n-type impurity are implanted into part of the polysilicon film 17 located in the NMISFET formation region Rnt at an injection energy of 10 keV and a dose of $8\times10^{15} \cdot cm^{-2}$.

In this embodiment, boron-doping to the polysilicon film 17 is not performed in this step, and boron ions are implanted into a gate electrode when ion implantation for forming a source/drain region is performed. The ion implantation for forming a source/drain region will be described later.

Figure 1D:
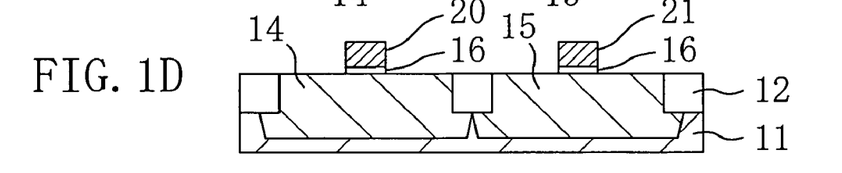

Next, in the process step of FIG. 1D, the polysilicon film 17 is patterned to form a gate electrode 20 of an n-channel MISFET and a gate electrode 21 of a p-channel MISFET. Note that in this case, the gate insulating film 16 may be left as it is or patterned so as to have the same shape as that of the gate electrodes 20 and 21, as shown in FIG. 1D. There are a plurality of kinds of MISFETs such as a high-speed MISFET of which a gate length is small and a low-leakage MISFET of which a gate length is large. Accordingly, the length of each of the gate electrodes 20 and 21 may be different between MISFETS. For example, the gate length of a gate electrode of a high-speed MISFET is about 65 nm and the gate length of a gate electrode of a low-leakage MISFET is about 90 nm.

Figure 1E:
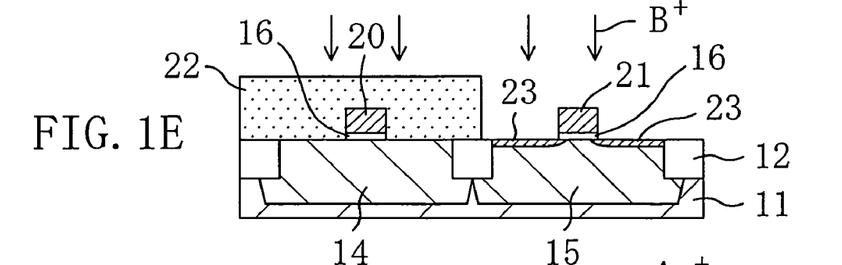

Next, in the process step of FIG. 1E, using the resist film 22 covering the NMISFET formation region Rnt and the gate electrode 21 as masks, boron ions ($B^+$) are implanted into the n-type well 15 at an injection energy of 0.5 keV and a dose of $4\times10^{14} \cdot cm^{-2}$ to form a lightly doped impurity region 23 to serve as an LDD region or an extension region of the PMISFET.

Figure 1F:
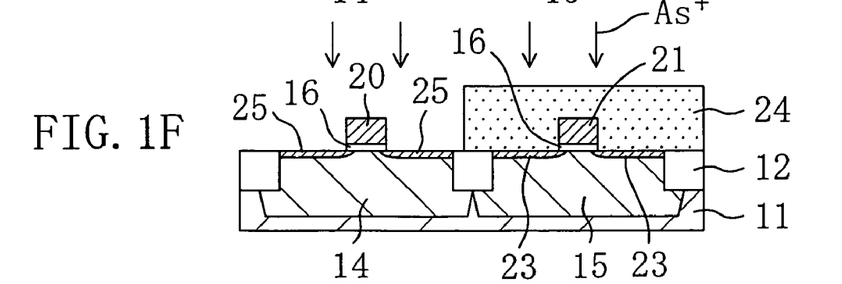

Next, in the process step of FIG. 1F, using a resist film 24 covering the PMISFET formation region Rpt and the gate electrode 20 as masks, arsenic ions ($As^+$) are implanted into the p-type well 14 at an injection energy of 5 keV and a dose of $8\times10^{14} \cdot cm^{-2}$ to form a lightly doped impurity region 25 to serve as an LDD region or an extension region of the NMISFET.

Figure 2A:
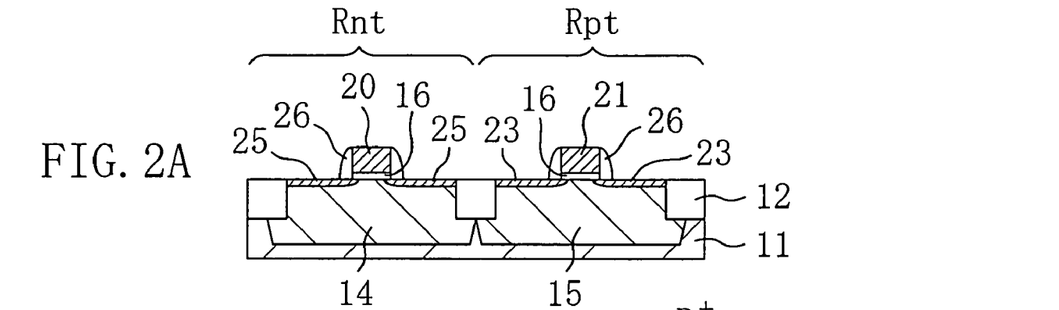
FIGS. 2A through 2E are cross-sectional views illustrating latter half of steps for fabricating the semiconductor device of the first embodiment.

Next, in the process step of FIG. 2A, an insulating film such as a silicon oxide film and a silicon nitride film is deposited over the substrate, and then the insulating film is etched back to form a sidewall 26 covering each of side surfaces of the respective gate electrodes 20 and 21 of the MISFETs.

Figure 2B:
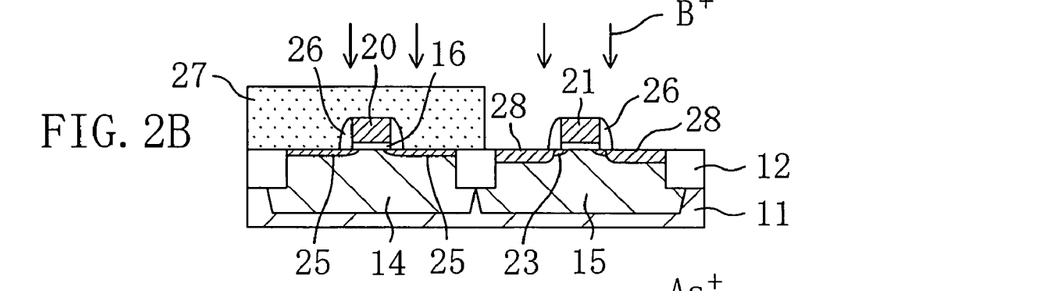

Next, in the process step of FIG. 2B, using the resist film 27 covering the NMISFET formation region Rnt, the gate electrode 21 and the sidewall 26 as masks, boron ions ($B^+$) are implanted into the n-type well 15 at an injection energy of 3 keV and a dose of $5\times10^{15} \cdot cm^{-2}$ to form a heavily doped impurity region 28 to serve as a source/drain region of the PMISFET. In this step, boron, i.e., a p-type impurity is introduced into the gate electrode 21 of the PMISFET.

Figure 2C:
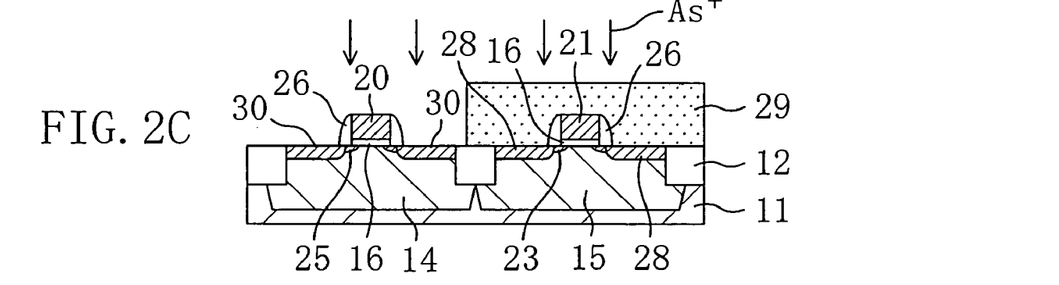

Next, in the process step of FIG. 2C, using the resist film 29 covering the PMISFET formation region Rpt, the gate electrode 20 and the sidewall 26 as masks, arsenic ions ($As^+$) are implanted into the p-type well 14 at an injection energy of 50 keV and a dose of $4\times10^{15} \cdot cm^{-2}$ to form a heavily doped impurity region 30 to serve as a source/drain region of the NMISFET.

Figure 2D:
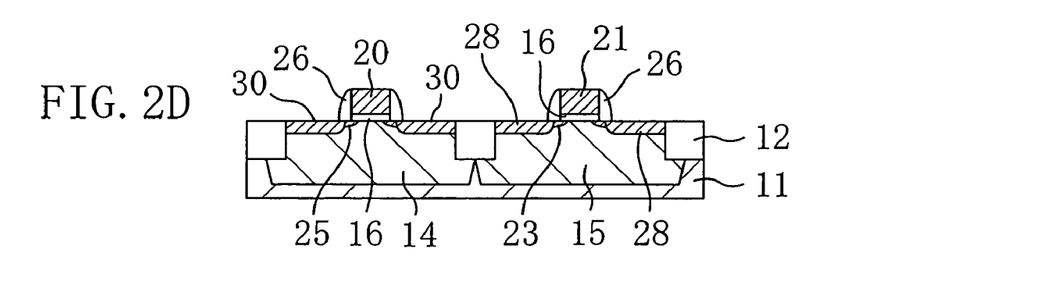

Next, in the process step of FIG. 2D, thermal treatment (first thermal treatment) at a low temperature for a long time for activating impurities (dopants) injected into the gate electrodes 20 and 21 is performed. In this case, the condition for the first thermal treatment is preferably that a temperature is in a range between 600° C. and 675° C. and a holding time at a peak temperature in thermal treatment is, for example, about 1 hour at 600° C. and about 30 minutes at 650° C. In thermal treatment under this condition, diffusion of boron into each crystal grain of polysilicon hardly occurs in the gate electrode 21 of the PMISFET and diffusion of boron in a grain boundary occurs. Accordingly, boron is hardly diffused in the semiconductor substrate 11 (single crystal). Note that diffusion of boron hardly occurs due to thermal treatment at a temperature of 550° C. even in a grain boundary. Therefore, it is preferable to perform thermal treatment at a temperature equal to or higher than 550° C. It has been confirmed that diffusion of boron into a crystal grain occurs in some degree due to thermal treatment at a temperature of 650° C. There are different heating methods such as heating in an electric furnace and heating by a lump and any heating method may be used.

Figure 2E:
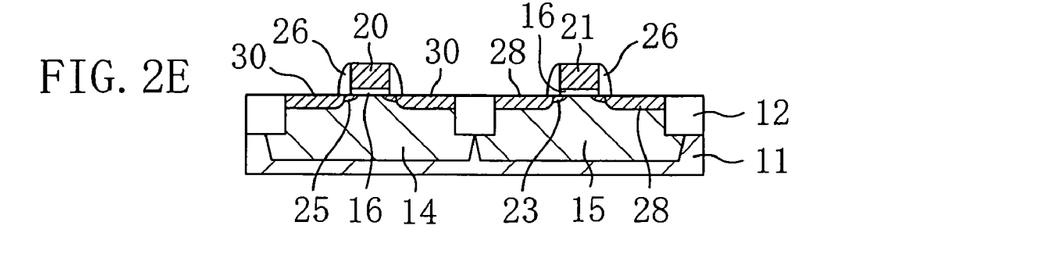

Next, in the process step of FIG. 2E, thermal treatment (second thermal treatment) at a high temperature for a short time for activating impurities (dopants) implanted into the gate electrodes 20 and 21 and the impurity doped regions 23, 25, 28 and 30 is performed. In this case, the condition for the thermal treatment is preferably that a temperature is in a range between 1050° C. and 1075° C. and a holding time at a peak temperature is preferably 0 or, if not 0, substantially 0. Due to thermal treatment under this condition, impurity diffusion into each crystal grain in a polysilicon layer and impurity diffusion in the semiconductor substrate (single crystal) occur. As such thermal treatment, a technique such as spike annealing, flash annealing and laser annealing in which a holding time at a peak temperature is 0 or substantially 0 is preferably used. The second thermal treatment is preferably performed at a temperature higher than 1000° C. and lower than 1100° C. for a shorter time than 10 seconds.

Note that after the process step of FIG. 2E, formation of an insulating film and formation of an interconnect layer are alternately repeated, thereby forming a multilayer interconnect layer. The multilayer interconnect layer can be formed according to various kinds of known methods and any known method may be used. Therefore, illustration and description of process steps for forming the multilayer interconnect layer will be omitted in this embodiment.

In the method for fabricating a semiconductor device according to this embodiment, the first and second thermal treatments are performed to activate impurities, so that the following effects can be achieved.

First, due to the first thermal treatment at a low temperature for a long time shown in FIG. 2D, boron in the gate electrode 21 of the PMISFET passes through a crystal boundary and is diffused in a region of the gate electrode 21 located around the boundary with the gate insulating film 16. In this case, if a temperature for thermal treatment is in the range between 600° C. and 675° C., boron diffusion in a crystal grain and the semiconductor substrate 11 (single crystal) can be substantially neglected.

Then, due to the second thermal treatment at a high temperature for a short time shown in FIG. 2E, boron is diffused from the crystal boundary into each crystal grain and boron is sufficiently activated in the gate electrode 21. Therefore, reduction in the drive capability of the PMISFET can be suppressed even when the dose of boron in the ion implantation in the process step of FIG. 2B is not particularly increased.

Moreover, due to the second thermal treatment at a high temperature for a short time shown in FIG. 2E, boron diffusion in the semiconductor substrate 11 occurs, so that boron is diffused also in the lightly doped impurity region 23 and the heavily doped impurity region 28 of the PMISFET and boron is activated. However, the dose of boron ion-implanted in the process step of FIG. 2B does not have to be increased and the heavily doped impurity region 28 is not magnified too much. A magnification amount of the heavily doped impurity region 28 due to boron diffusion in the second thermal treatment is in the range of 20–30 nm in this embodiment.

Note that due to the first thermal treatment, boron passes through each crystal boundary of the gate electrode 21 to reach around a lower surface of the gate electrode 21, but boron is not diffused in each crystal grain. Therefore, a boron concentration in a region of the gate electrode 21 located around the lower surface thereof is not very high. Thus, it is possible to effectively suppress entrance of boron in the gate electrode 21 through the gate insulating film 16 into a channel region of the semiconductor substrate 11 due to the second thermal treatment. Therefore, change in the threshold voltage of the PMISFET due to so-called "passing-through" of boron is not caused or, if any, is so small that the change can be neglected.

In contrast, when an impurity injected into the gate electrode is activated by performing thermal treatment once as in the known method, it is necessary take a certain amount of time to diffuse the impurity injected into upper part of the gate electrode in each crystal grain in a region of the gate electrode located around a lower surface thereof. Thus, there is high possibility that the impurity is diffused at high speed in each crystal boundary and passes through the gate insulating film to enter into a channel region during the diffusion of the impurity.

Therefore, according to the method for fabricating a semiconductor device according to this embodiment, even when the size of a transistor is reduced, entrance of an impurity in a gate electrode including a polysilicon layer into a channel region and depletion of the gate electrode can be suppressed, so that a semiconductor device including a transistor with high drive capability and a stable threshold voltage can be obtained.

Note that in this embodiment, the method for fabricating a semiconductor device including a gate electrode made of a polysilicon single layer has been described. However, the present invention is not limited to this embodiment, but a gate electrode having a polycide structure may be used. In that case, silicide of upper part of the gate electrode can be performed using a known silicide process after the gate electrode has been formed.

Second Embodiment

FIGS. 3A through 3F and FIGS. 4A through 4E are cross-sectional views illustrating respective steps for fabricating a semiconductor device of a second embodiment of the present invention. In this embodiment, respective steps for fabricating a semiconductor device having a two-layer polysilicon gate structure and a dual gate structure will be described.

Figure 3A:
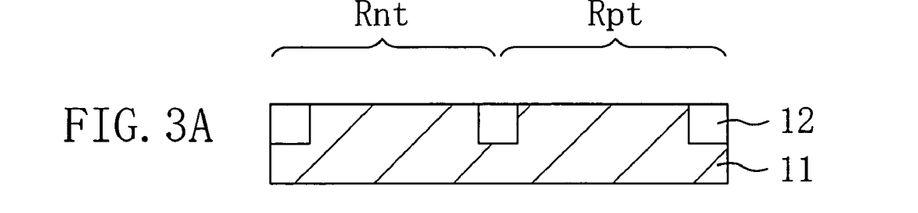
FIGS. 3A through 3F are cross-sectional views illustrating first half of steps for fabricating a semiconductor device according to a second embodiment of the present invention.
Figure 3B:
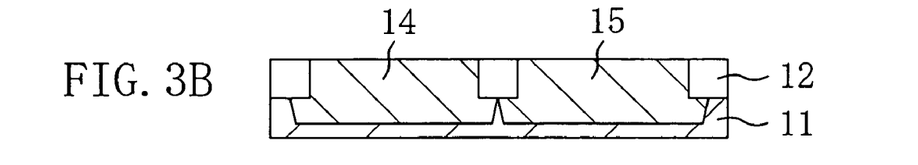

First, in the process step of FIG. 3A, an isolation region 12 for dividing a surface region into a plurality of active regions is formed on a p-type semiconductor substrate 11 (silicon substrate), and then, in the process step of FIG. 3B, impurity injection for adjusting threshold and impurity injection for forming a well are performed to form a p-type well 14, i.e., an active region for an n-channel MISFET (NMISFET formation region Rnt) and an n-type well 15, i.e., an active region for a p-channel MISFET (PMISFET formation region Rpt).

Figure 3C:
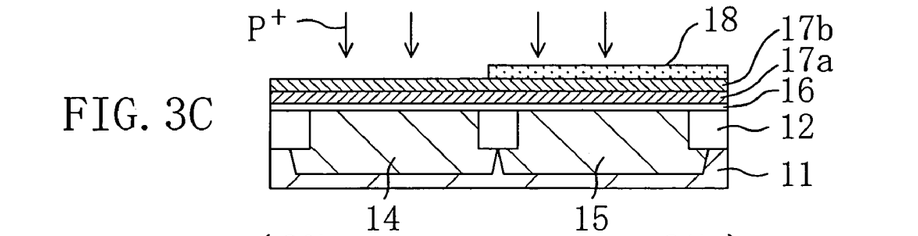

Next, in the process step of FIG. 3C, a gate insulating film 16 is formed on each of the wells 14 and 15, and a lower silicon film 17a and an upper silicon film 17b are formed over the gate insulating film 16. In this case, the thickness of the gate insulating film is, for example, about 2 nm. The thickness of the lower silicon film 17a is, for example, about 80 nm. When an amorphous silicon film is formed as the lower silicon film, the amorphous silicon film is later to be changed into a polysilicon film having a relatively large grain size (average grain diameter of a crystal grain) of, for example, about 0.4 μm through a thermal history of the step of forming a sidewall and the like. However, as the lower silicon film 17a, a polysilicon film having a large grain size may be used. The upper silicon film 17b is formed of polysilicon having a small grain size. The thickness of the upper silicon film 17b is, for example, about 80 nm and the size of grains in polysilicon constituting the upper silicon film 17b is, for example, about 25 nm. The grain size of polysilicon of the upper silicon film 17b is much smaller than that of the lower silicon film 17a. Thereafter, a resist film 18 covering the PMISFET formation region Rpt is formed, and then, using the resist film 18 as a mask, ions of phosphorus ($P^+$), i.e., an n-type impurity are implanted into part of the upper polysilicon film 17b located in the NMISFET formation region Rnt at an injection energy of 10 keV and a dose of $8 \times 10^{15} \cdot cm^{-2}$.

In this embodiment, boron doping to the upper polysilicon film 17b is not performed in this step, and boron ions are implanted into a gate electrode when ion implantation for forming a source/drain region is performed. The ion implantation for forming a source/drain region will be described later.

Figure 3D:
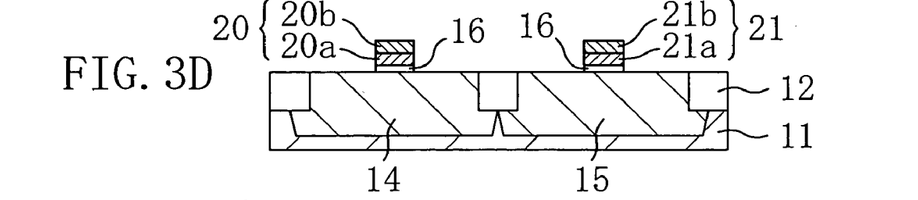

Next, in the process step of FIG. 3D, the lower silicon film 17a and the upper silicon film 17b are patterned to form a gate electrode 20 of an n-channel MISFET and a gate electrode 21 of a p-channel MISFET. The gate electrode 20 of the NMISFET includes a lower gate electrode 20a made of polysilicon having a large gain size and an upper gate electrode 20b made of polysilicon having a small grain size. The gate electrode 21 of the PMISFET includes a lower gate electrode 21a made of polysilicon having a large grain size and an upper gate electrode 21b made of polysilicon having a small grain size. However, although there is high possibility that each of the lower gate electrodes 20a and 21a is an amorphous silicon layer at the time of the process step of FIG. 3D, the amorphous silicon film is later to be changed into a polysilicon layer having a large grain size through the step of high temperature treatment when a sidewall is formed. Note that in this case, the gate insulating film 16 may be left as it is or patterned so as to have the same shape as that of the gate electrodes 20 and 21 as shown in FIG. 3D. For example, as in the first embodiment, the gate length of a gate electrode of a high-speed MISFET is about 65 nm and the gate length of a gate electrode of a low-leakage MISFET is about 90 nm.

Figure 3E:
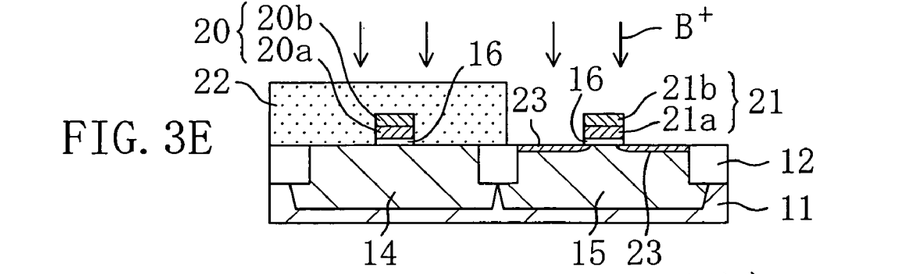

Next, in the process step of FIG. 3E, using the resist film 22 covering the NMISFET formation region Rnt and the gate electrode 21 as masks, boron ions ($B^+$) are implanted into the n-type well 15 at an injection energy of 0.5 keV and a dose of $4 \times 10^{14} \cdot cm^{-2}$ to form a lightly doped impurity region 23 to serve as an LDD region or an extension region of the PMISFET.

Figure 3F:
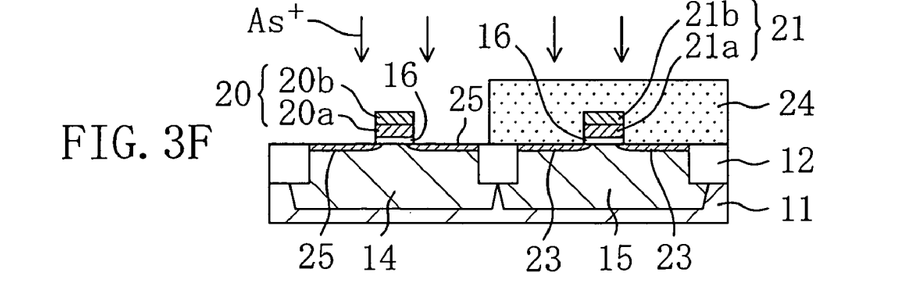

Next, in the process step of FIG. 3F, using a resist film 24 covering the PMISFET formation region Rpt and the gate electrode 20 as masks, arsenic ions ($As^+$) are implanted into the p-type well 14 at an injection energy of 5 keV and a dose of $8 \times 10^{14} \cdot cm^{-2}$ to form a lightly doped impurity region 25 to serve as an LDD region or an extension region of the NMISFET.

Figure 4A:
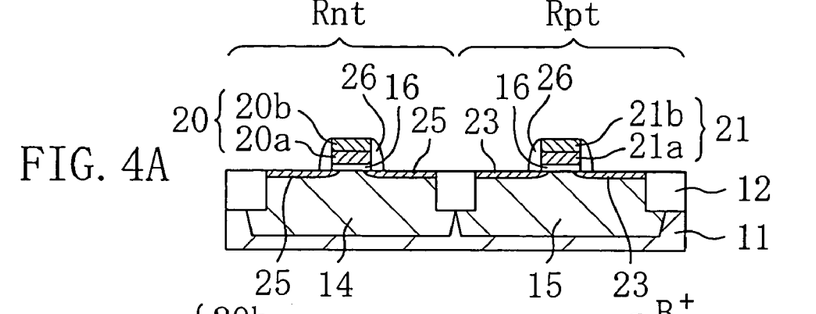
FIGS. 4A through 4E are cross-sectional views illustrating latter half of steps for fabricating the semiconductor device of the second embodiment.

Next, in the process step of FIG. 4A, an insulating film such as a silicon oxide film and a silicon nitride film is deposited over the substrate, and then the insulating film is etched back to form a sidewall 26 covering each of side surfaces of the respective gate electrodes 20 and 21 of the MISFETs.

Figure 4B:
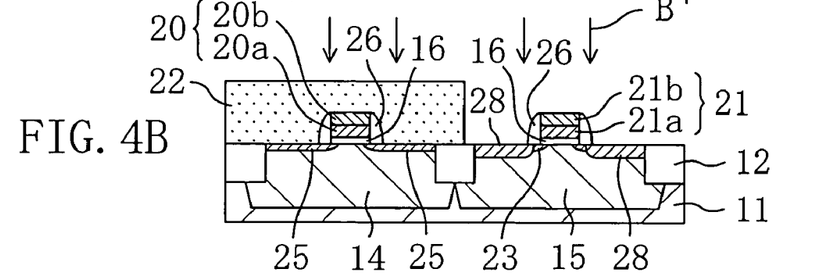

Next, in the process step of FIG. 4B, using the resist film 27 covering the NMISFET formation region Rnt, the gate electrode 21 and the sidewall 26 as masks, boron ions ($B^+$) are implanted into the n-type well 15 at an injection energy of 3 keV and a dose of $5 \times 10^{15} \cdot cm^{-2}$ to form a heavily doped impurity region 28 to serve as a source/drain region of the PMISFET. In this step, boron, i.e., a p-type impurity is introduced into the gate electrode 21 of the PMISFET.

Figure 4C:
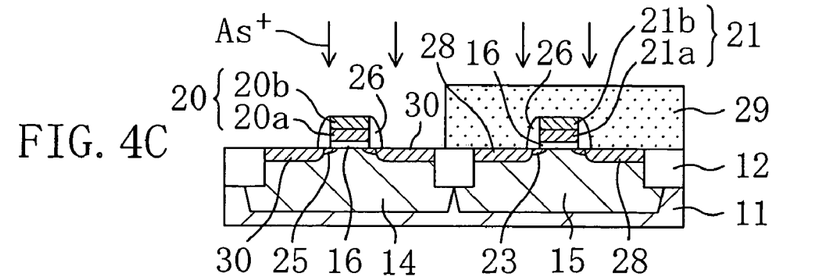

Next, in the process step of FIG. 4C, using the resist film 29 covering the PMISFET formation region Rpt, the gate electrode 20 and the sidewall 26 as masks, arsenic ions ($As^+$) are implanted into the p-type well 14 at an injection energy of 50 keV and a dose of $4 \times 10^{15} \cdot cm^{-2}$ to form a heavily doped impurity region 30 to serve as a source/drain region of the NMISFET.

Figure 4D:
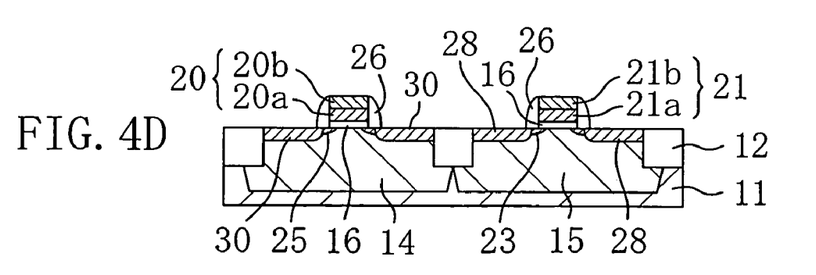

Next, in the process step of FIG. 4D, thermal treatment (first thermal treatment) at a low temperature for a long time for activating impurities (dopants) injected into the gate electrodes 20 and 21 is performed. In this case, the condition for the first thermal treatment is preferably that a temperature is in a range between 600° C. and 675° C. and a holding time at a peak temperature in thermal treatment is, for example, about 1 hour at 600° C. and about 30 minutes at 650° C. In thermal treatment under this condition, diffusion of boron into each crystal grain of polysilicon hardly occurs in the gate electrode 21 of the PMISFET and diffusion of boron in a grain boundary occurs. Accordingly, boron is hardly diffused in the semiconductor substrate 11. Note that diffusion of boron hardly occurs due to thermal treatment at a temperature of 550° C. even in a grain boundary. It has been confirmed that diffusion of boron into a crystal grain occurs in some degree due to thermal treatment at a temperature of 650° C. There are different heating methods such as heating in an electric furnace and heating by a lump and any heating method may be used.

Figure 4E:
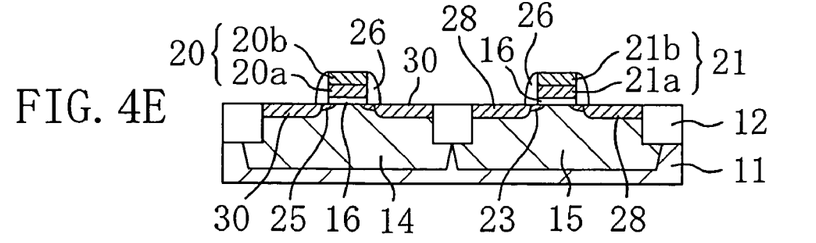

Next, in the process step of FIG. 4E, thermal treatment (second thermal treatment) at a high temperature for a short time for activating impurities (dopants) implanted into the gate electrodes 20 and 21 and the impurity doped regions 23, 25, 28 and 30 is performed. In this case, the condition for the thermal treatment is preferably that a temperature is in a range between about 1050° C. and 1075° C. and a holding time at a peak temperature is 0 or, if not 0, substantially 0.

As such thermal treatment, a technique such as spike annealing, flash annealing and laser annealing is preferably used.

Note that after the process step of FIG. 4E, formation of an insulating film and formation of an interconnect layer are alternately repeated, thereby forming a multilayer interconnect layer. The multilayer interconnect layer can be formed according to various kinds of known methods and any known method may be used. Therefore, illustration and description of process steps for forming the multilayer interconnect layer will be omitted in this embodiment.

Figure 5:
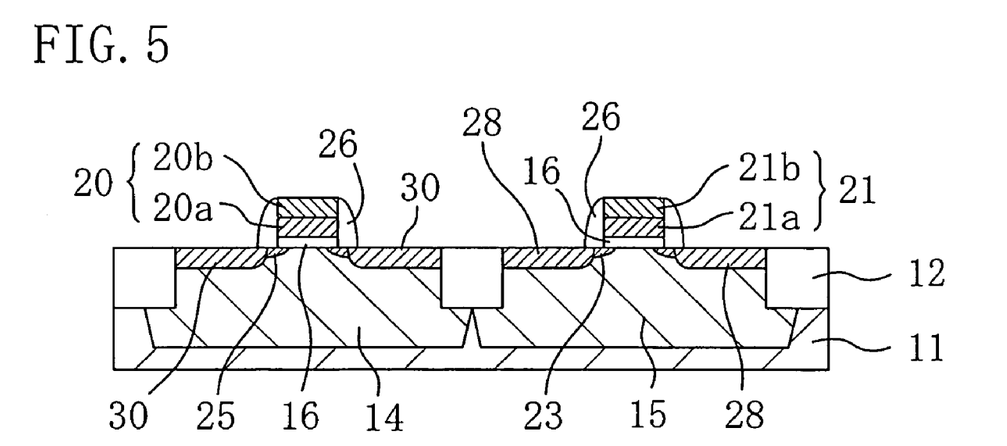
FIG. 5 is a cross-sectional view of the semiconductor device of the second embodiment.

FIG. 5 is a cross-sectional view illustrating a semiconductor device fabricated according to the fabrication method of this embodiment. As shown in FIG. 5, the semiconductor device of this embodiment includes an NMISFET and a PMISFET each of which is provided in an active region surrounded by the isolation region 12. The NMISFET includes a p-type well 14 formed in part of a semiconductor substrate 11 (silicon substrate), a gate insulating film 16 formed on the p-type well 14, a gate electrode 20 formed on the gate insulating film 16, a sidewall 26 covering side surfaces of the gate electrode 20, a source/drain region including a lightly doped impurity region 25 and a heavily doped impurity region 30 and provided in each of respective regions of the p-type well 14 located on both sides of the gate electrode 20.

The gate electrode 20 of the NMISFET includes a lower gate electrode 20a made of polysilicon having a large gain size and an upper gate electrode 20b made of polysilicon having a small grain size. The gate electrode 21 of the PMISFET includes a lower gate electrode 21a made of polysilicon having a large grain size and an upper gate electrode 21b made of polysilicon having a small grain size.

In the method for fabricating a semiconductor device according to this embodiment, the first and second thermal treatments are performed to activate impurities, so that the following effects can be achieved.

First, in the first thermal treatment at a low temperature for a long time shown in FIG. 4D, boron in the upper gate electrode 21b of the gate electrode 21 of the PMISFET having a small grain size passes through a crystal boundary to reach an upper surface of the lower gate electrode 21a. In this case, since the grain size of the lower gate electrode 21a is very large, a small number of crystal boundaries exits and thus boron diffusion in the lower electrode 21a does not progress so much. Accordingly, boron is hardly diffused in a region of the lower gate electrode 21a located around the lower surface thereof (i.e., around the boundary with the gate insulating film 16). That is, if a temperature for thermal treatment is in the range between 600° C. and 675° C. in this case, boron diffusion in each crystal grain of the upper gate electrode 21b, the lower gate electrode 21a and the semiconductor substrate 11 (single crystal) can be substantially neglected.

Then, in the first thermal treatment at a high temperature for a short time shown in FIG. 4E, boron is diffused from each crystal boundary of the upper gate electrode 21b and the lower gate electrode 21a to each crystal grain and boron is sufficiently activated in the gate electrode 21. Therefore, reduction in the drive capability of the PMISFET can be suppressed even when the dose of boron in the ion implantation in the process step of FIG. 4B is not particularly increased.

Moreover, due to the second thermal treatment at a high temperature for a short time shown in FIG. 4E, boron diffusion in the semiconductor substrate 11 (single crystal) occurs, so that boron is diffused also in the lightly doped impurity region 23 and the heavily doped impurity region 28 of the PMISFET and boron is sufficiently activated. Then, the dose of boron in the ion implantation in the process step of FIG. 4B is not particularly large and thus the lightly doped impurity region 23 and the heavily doped impurity region 28 of the PMISFET are not magnified too much. A magnification amount of each of the lightly impurity-dope region 23 and the heavily doped impurity region 28 of the PMISFET due to boron diffusion in the second thermal treatment is in the range of 20–30 nm in this embodiment.

Specifically, in this embodiment, compared to the effects of the first embodiment, more advantageous effects shown in the following description can be achieved.

In this embodiment, due to the first thermal treatment, boron passes through each grain boundary in the upper gate electrode 21b of the PMISFET to reliably reach the boundary of the upper gate electrode 21b with the lower gate electrode 21a. However, the second thermal treatment is performed at a high temperature for a short time, so that boron in the upper gate electrode 21b hardly passes through the lower gate electrode 21a and the gate insulating film 16 to enter into a channel region of the semiconductor substrate 11 due to the second thermal treatment. Moreover, the number of crystal boundaries in the lower gate electrode 21a is small and thus very small amount of boron reaches the lower surface of the lower gate electrode 21a due to the first thermal treatment. Thus, change in the threshold voltage of the PMISFET due to so-called "pass-through" of boron can be effectively suppressed.

Therefore, when the size of a transistor is reduced according to the method for fabricating a semiconductor device of this embodiment, entrance of an impurity of a gate electrode including a polysilicon layer into a channel region and depletion of the gate electrode can be more effectively suppressed.

Note that two or more polysilicon layers may exist to form the upper gate electrode. In the case where two or more polysilicon layers are present, it is preferable that the grain size of each of the polysilicon layers is larger than that of a polysilicon layer constituting a lower gate and as small as that of the upper gate.

Third Embodiment

Figure 6:
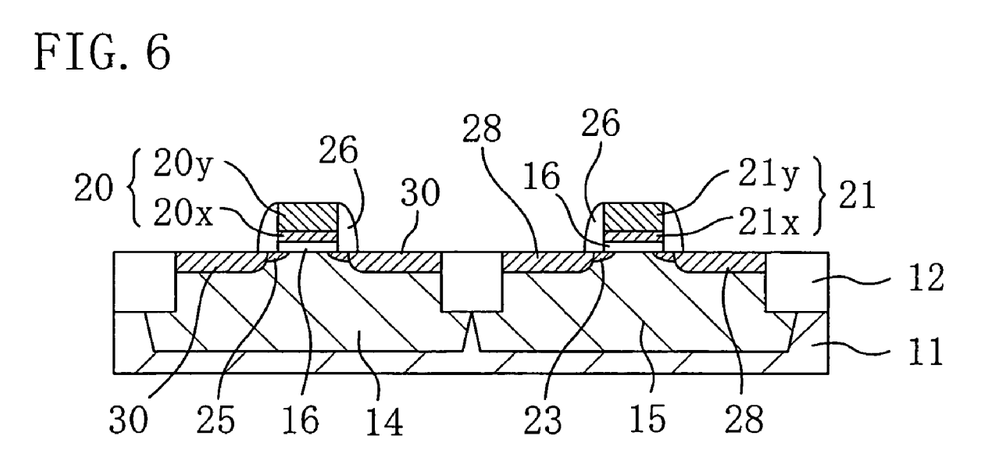
FIG. 6 is a cross-sectional view of a semiconductor device according to a third embodiment of the present invention.

FIG. 6 is a cross-sectional view illustrating a semiconductor device according to a third embodiment of the present invention. In this embodiment, a semiconductor device having a two-layer polysilicon gate structure and a dual gate structure will be described. A method for fabricating a semiconductor device according to this embodiment is basically the same as that of the second embodiment. Therefore, illustration and description will be omitted.

As shown in FIG. 6, the semiconductor device of this embodiment includes an NMISFET and a PMISFET each of which is provided in an active region surrounded by the isolation region 12. The NMISFET includes a p-type well 14 formed in part of a semiconductor substrate 11, a gate insulating film 16 formed on the p-type well 14, a gate electrode 20 formed on the gate insulating film 16, a sidewall 26 covering a side surface of the gate electrode 20, a source/drain region including a lightly doped impurity region 25 and a heavily doped impurity region 30 and provided in each of respective regions of the p-type well 14 located on both sides of the gate electrode 20.

The gate electrode 20 of the NMISFET includes a lower gate electrode 20x made of polysilicon having a large gain size and an upper gate electrode 20y made of polysilicon having a small grain size. The gate electrode 21 of the PMISFET includes a lower gate electrode 21x made of polysilicon having a large grain size and an upper gate electrode 21y made of polysilicon having a small grain size.

The basic structure of each MISFET of this embodiment is the same as that of each MISFET of the second embodiment shown in FIG. 5. However, this embodiment differs from the first embodiment in that each of the lower gate electrodes 20x and 21x is formed to have a smaller thickness than that of each of the upper electrodes 20y and 21y.

In this embodiment, the thickness of each of the lower gate electrodes 20x and 21x is about 30 nm and the thickness of each of the upper gate electrodes 20y and 21y is about 130 nm. The thickness of each of the lower gate electrodes 20x and 21x is determined at a level at which boron existing around a lower surface of the upper gate electrode 21y of the PMISFET substantially does not reach a lower surface of the lower gate electrode 21x when the second thermal treatment (i.e., the step of FIG. 4E) at a high temperature for a short time is performed. Specifically, the thickness of each of the lower gate electrodes 20x and 21x is determined to be substantially equal to or larger than a magnification amount of a heavily doped impurity region 28 of the PMISFET due to boron diffusion in the second thermal treatment.

Thus, with the semiconductor device of this embodiment, even when the size of a transistor is reduced, the same effects as those of the second embodiment can be achieved. In addition, in this embodiment, compared to the second embodiment, the lower gate electrode 21x of the PMISFET has a smaller thickness than that of the upper gate electrode 21y of the PMISFET, so that boron can be diffused to reach a region of the gate electrode 21 close to the gate insulating film 16. Therefore, depletion of the lower gate electrode 21x of the PMISFET can be reliably suppressed. Furthermore, entrance of boron into a channel region when the second thermal treatment is performed can be reliably suppressed.

As described in the second embodiment, the magnification amount of the heavily doped impurity region 28 of the PMISFET due to boron diffusion in the second thermal treatment is about 20–30 nm. Therefore, in this embodiment, the thickness of each of the lower gate electrodes 20x and 21x is preferably 20 nm or more. On the other hand, if the thickness of the lower gate electrode 21x of the PMISFET is too large, depletion of the lower gate electrode 21x is caused. Therefore, the thickness of the lower gate electrode 21x is preferably 50 nm or less.

Note that in each of the above-described embodiments, boron is not introduced into the polysilicon film in the PMISFET formation region. However, when thermal treatment in which boron is substantially diffused is not performed in any one of the process steps from the process step of forming a polysilicon film to the process step of ion implantation for forming a source/drain region, boron may be ion-implanted into part of the polysilicon film located in the PMISFET formation region Rpt before or after the process step of FIG. 1C or FIG. 3C.

The gate insulating film of each of the above-described embodiments may be a silicon oxide film and also may be a silicon oxynitride film.

According to an inventive semiconductor device and an inventive method for fabricating the same, entrance of an impurity in a gate electrode including a polysilicon layer into a channel region and depletion of the gate electrode can be effectively suppressed. Therefore, a semiconductor device with high drive capability and a stable threshold voltage can be obtained.

What is claimed is:

1. A method for fabricating a semiconductor device, comprising the steps of:
   a) forming a gate insulating film over an active region of a substrate;
   b) forming a silicon film over the gate insulating film;
   c) patterning the silicon film, thereby forming a gate electrode;
   d) performing ion implantation of an impurity using at least the gate electrode as a mask, thereby forming a source/drain region including a heavily doped impurity region;
   e) performing first thermal treatment for activating the impurity introduced into the gate electrode; and
   f) performing second thermal treatment for activating the impurity introduced into the gate electrode and the source/drain region at a higher temperature for a shorter time than the first thermal treatment is performed,
   wherein the active region includes an NMISFET formation region and a PMISFET formation region,
   wherein in the step c), a gate electrode of the NMISFET and a gate electrode of the PMISFET are formed,
   wherein in the step d), an n-type impurity and a p-type impurity are separately ion-implanted into the NMISFET formation region and the PMISFET formation region, respectively,
   wherein after the step b) and before the step c), an n-type impurity is ion-implanted into part of the silicon film located in the NMISFET formation region while introduction of an impurity is not performed to part of the silicon film located in the PMISFET formation region, and a p-type impurity is introduced into the gate electrode of the PMISFET.

2. The method of claim 1, further comprising:
   after the step c) and before the step d),
   the step of performing ion implantation of an impurity at a low concentration using the gate electrode as a mask, thereby forming a lightly doped impurity region; and
   the step of forming a sidewall covering a side surface of the gate electrode,
   wherein in the step d), ion implantation of an impurity is performed at a high concentration using the gate electrode and the sidewall as masks, thereby forming a source/drain region including the lightly doped impurity region and the heavily doped impurity region.

3. The method of claim 1,
   wherein in the step of e), the first thermal treatment is performed at a temperature higher than 550°C. and lower than 650° C. for a time equal to or longer than 10 seconds, and
   wherein in the step f), the second thermal treatment is performed at a temperature higher than 1000° C. and lower than 1100° C. and for a time equal to or longer than 10 seconds.

4. The method of claim 3, wherein in the step f), as the second thermal treatment, flash annealing or spike annealing is performed.

5. The method of claim 1, wherein in the step b), a lower silicon film and an upper silicon film made of polysilicon and including at least a single layer is formed, thereby obtaining, before the step d), a lower gate electrode made of polysilicon having a large grain size and an upper gate electrode made of polysilicon having a smaller grain size than that of the lower gate electrode and including at least a single layer.

6. The method of claim 5, wherein in the step b), an amorphous silicon film is formed as the lower silicon film.

7. The method of claim 5, wherein the thickness of the lower silicon film formed in the step b) is larger than a dimension by which the heavily doped impurity region of the source/drain region is magnified due to the second thermal treatment and smaller than the thickness of the upper silicon film.

8. The method of claim 5, wherein the thickness of the lower silicon film formed in the step b) is not less than 20 nm and not more than 50 nm.

9. A semiconductor device comprising:
   a substrate;
   a gate insulating film formed over an active region of the substrate:
   a gate electrode formed over the gate insulating film and including a lower gate electrode made of polysilicon having a large gain size and an upper gate electrode having a smaller grain size than that of the lower electrode and including at least a single polysilicon layer; and
   a source/drain region formed in each of respective regions of the active region located on both sides of the gate electrode and including a heavily doped impurity region,
   wherein the thickness of the lower gate electrode is larger than a dimension by which the heavily doped impurity region of the source/drain region is magnified when thermal treatment for activating the impurity in the gate electrode is performed and smaller than the thickness of the upper gate electrode.

10. The semiconductor device of claim 9,
    wherein the source/drain region is formed in a region of the active region located between the heavily doped impurity region and a region of the active region located directly under the gate electrode and includes a lightly doped impurity region containing an impurity at a lower concentration than that in the heavily doped impurity region, and
    wherein the semiconductor device further includes a sidewall covering a side surface of the gate electrode.

11. The semiconductor device of claim 9, wherein the thickness of the lower gate electrode is not less than 20 nm and not more than 50 nm.

* * * * *